(12) United States Patent
Haugen et al.

(10) Patent No.: US 8,325,485 B2
(45) Date of Patent: Dec. 4, 2012

(54) REMOVABLE SYSTEM MANAGEMENT INFORMATION DISPLAY

(75) Inventors: Kenneth Haugen, Boise, ID (US); Barry Silvester, San Diego, CA (US)

(73) Assignee: Gateway, Inc., Irvine, CA (US)

( * ) Notice: Subject to any disclaimer, the term of this patent is extended or adjusted under 35 U.S.C. 154(b) by 1008 days.

(21) Appl. No.: 12/317,803

(22) Filed: Dec. 30, 2008

(65) Prior Publication Data
US 2010/0164843 A1    Jul. 1, 2010

(51) Int. Cl.
*G06F 1/16* (2006.01)
(52) U.S. Cl. .......... 361/728; 361/679.21; 361/724; 361/725; 312/223.1; 312/223.2; 345/55
(58) Field of Classification Search ............. 361/728
See application file for complete search history.

(56) References Cited

U.S. PATENT DOCUMENTS

| | | | |
|---|---|---|---|
| 4,481,512 A | 11/1984 | Tscheulin | |
| 4,870,531 A | 9/1989 | Danek | |
| 5,233,502 A | 8/1993 | Beatty | |
| 5,347,630 A | 9/1994 | Ishizawa et al. | |
| 5,715,136 A | 2/1998 | Noe et al. | |
| 5,949,640 A * | 9/1999 | Cameron et al. | 361/600 |
| 6,185,110 B1 * | 2/2001 | Liu | 361/829 |
| 6,388,878 B1 * | 5/2002 | Chang | 361/679.48 |
| 6,590,547 B2 | 7/2003 | Moriconi et al. | |
| 6,643,126 B2 * | 11/2003 | Su | 361/679.48 |
| 6,661,653 B1 | 12/2003 | Holmen | |
| 6,724,635 B2 | 4/2004 | Larson et al. | |
| 6,901,557 B1 * | 5/2005 | Martinez et al. | 715/772 |
| 7,173,818 B2 * | 2/2007 | Hou et al. | 361/679.56 |
| 7,209,347 B2 * | 4/2007 | Liang et al. | 361/752 |
| 7,474,229 B2 * | 1/2009 | Franz et al. | 340/815.4 |
| 7,612,990 B2 * | 11/2009 | Larson et al. | 361/679.21 |
| 7,619,897 B2 * | 11/2009 | Della Fiora et al. | 361/724 |
| 7,643,303 B1 * | 1/2010 | Heistand et al. | 361/724 |
| 7,898,803 B2 * | 3/2011 | Huang | 361/679.6 |
| 8,161,391 B2 * | 4/2012 | McClelland et al. | 715/735 |
| 2002/0084994 A1 * | 7/2002 | Hansen | 345/204 |
| 2005/0195075 A1 * | 9/2005 | McGraw et al. | 340/500 |
| 2006/0039122 A1 * | 2/2006 | Yen | 361/724 |
| 2007/0019387 A1 * | 1/2007 | Schipper et al. | 361/725 |
| 2008/0165505 A1 * | 7/2008 | McCoy et al. | 361/725 |

OTHER PUBLICATIONS

Poethke, Jr, Removable Liquid Crystal Display for a Personal Computer, Website, Mar. 1, 1987, 1-3, IP.com, USA.
IBM, Shared System Status Display/Control Unit for Rackmounted Devices, Website, May 27, 2005, 1-5, IP.com, USA.
Author Unknown, ArrayMasStor, Manual, date unknown, 1-34, Advanced Technology and Systems Co. Ltd., USA.

* cited by examiner

*Primary Examiner* — Anthony Q Edwards
(74) *Attorney, Agent, or Firm* — McClure, Qualey & Rodak, LLP (57) ABSTRACT

A display system is disclosed for an information system component that includes a case with a first connector. The display system comprises a housing, a screen mounted on the housing and configured to display information, a control mounted on the housing for controlling an aspect of operation of the screen, and a mount structure configured to connect the housing to the information system component. The mount structure is configured to removably mount the housing on the case of the information system component. The mount structure includes a second connector configured to removably connect to the first connector on the case of the information system component.

18 Claims, 5 Drawing Sheets

REMOVABLE SYSTEM MANAGEMENT INFORMATION DISPLAY

BACKGROUND

1. Field

The present disclosure relates to information displays, and more particularly pertains to a new removable system management information display for providing an information display that is movable between and usable with a plurality of different information handling components and that provides a larger display of information than may be possible with a display that is dedicated to and integrated on a single information handling component.

2. Description of the Prior Art

The mounting of the various components of an information handling system on a rack system can facilitate the collocation of a large number of the components, such as processors, switches, storage drives, as well as other items, in a relatively more compact space. Rack mounting systems for information handling systems are highly standardized, with the width and depth of the unit of each component being generally uniform. A rack unit is a unit of measure used to describe the height of a component mountable in a rack system. One rack unit, which is commonly referred to as "1U", is typically approximately 1.75 inches (approximately 44.45 mm) high, and the width of the rack space is typically approximately 19 inches (in a 19-inch rack system) or approximately 23 inches (in a 23-inch rack system).

However, as the space in the rack is generally not physically divided in the vertical height direction, components mountable on a rack system are not necessarily limited to the 1U footprint. Thus, components that are larger than the 1U size may be mounted on the rack system. The sizes of the components tend to be integer multiples of the 1U size, such as components that are twice as high as 1U (and are referred to as "2U"), units that are three times as high as 1U (and are referred to as "3U"), and so forth. Components may be structured, for example, as an enclosed cabinet or a relatively open tray, although other structures for supporting the components on the rack system are possible.

Despite the ability to construct and mount components that are larger than 1U, it is generally desirable to keep the height of the tray or cabinet of a component as small as possible to minimize the footprint of the component in the rack, so that more components may be fit into a given rack. The rack system may be relatively deep, up to 36 inches or more, and thus elements of the component may be arranged relatively deeply behind the front panel of the component. As a result, there is an effort to limit the footprint of a component to 1U (or perhaps 2U if necessary), and thus many components on a rack system are only 1.75 inches high.

The limited space available on the front panel of a rack-mountable component does not provide a large area for communicating component status information from the front panel when positioned in the rack, which is highly convenient for those working with the components mounted on the rack system. Further, the overall area of the front panel is highly elongated, so not all of the area can be effectively utilized without spreading out the status information over a long area. This limitation is especially true in the case of 1U size components but even applies to 2U size and 3U size components. Generally, the status information must be communicated through a plurality of labeled light emitting diodes (LEDs) or single or double line displays that are not larger than the 1.75 inch height. Generally, physical and structural conditions for a cabinet or tray further limit the height of any display is limited to something significantly smaller than the 1.75 inch overall height. Also, the relatively small size of the display elements means that information (such as text) displayed on such elements tend to be small and difficult to read or recognize, and that the amount of information that can be communicated at one time is also limited.

Moreover, the visual status information for each component is usually not needed on a continuous basis, but only as operators or service technicians periodically visually scan the front panels looking for normal operation indicators or anomalies. Thus, while the information communicated from the front panel is important, this importance is not continuous over time.

Of course, the elements employed for communicating the status information from the front panel add expense to manufacture and maintain the component, and the more information that is sought to be communicated from the front panel, the greater the added expense. Not only do these elements add expense, but there can be a cost in terms of the space taken up by these elements in the component that cannot be utilized for more functional elements of the component.

Therefore, it is believed that there is a need for an apparatus that communicates information from the front panel of a rack-mountable component but is not is not incorporated into every component for which it provides information, and thus is not limited to use with only one component or limited by the physical footprint of the front panel of the component.

SUMMARY

In view of the foregoing disadvantages inherent in the known information displays, the present disclosure describes a new removable system management information display which may be utilized for providing an information display that is movable between and usable with a plurality of different information handling components and that provides a larger display of information than may be possible with a display that is dedicated to and integrated on a single information handling component.

The present disclosure relates to a new display system for an information system component that may include a case with a first connector. The display system comprises a housing, a screen mounted on the housing and configured to display information, a control mounted on the housing for controlling an aspect of operation of the screen, and a mount structure configured to connect the housing to the information system component. The mount structure is configured to removably mount the housing on the case of the information system component. The mount structure includes a second connector configured to removably connect to the first connector on the case of the information system component.

In another aspect of the invention, the display system comprises at least two information system components, with each of the information system components including a case with a first connector on the case. The display system also includes a display apparatus removably mounted on one of the information system components for displaying information regarding operation of the one information system component. The display apparatus comprises a housing having a front face with an opening therein, a screen mounted on the housing and viewable through the opening in the housing, and a mount structure configured to connect the housing to the information system component. The mount structure removably mounts the housing on the case of the information system component. The mount structure includes a second connector configured to removably connect to the first connector on the case of the information system component.

The foregoing is a general outline of some of the more significant aspects of the disclosure, and the detailed description of this application that follows discloses additional features of the disclosure which form the subject matter of the claims appended hereto.

The advantages of the various embodiments of the present disclosure, along with the various features of novelty that characterize the embodiments, are disclosed in the following descriptive matter and accompanying drawings.

BRIEF DESCRIPTION OF THE DRAWINGS

The disclosure will be better understood when consideration is given to the following detailed description thereof. Such description makes reference to the annexed drawings wherein.

DESCRIPTION OF PREFERRED EMBODIMENTS

With reference now to the drawings, and in particular to FIGS. 1 through 5 thereof, the removable system management information display of the present disclosure is generally designated by the reference numeral 10 in this description. A method of utilizing the apparatus is also disclosed in this description.

In the following detailed description of preferred embodiment and other embodiments according to the present disclosure, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

This disclosure relates to a display system 10 that is highly suitable for use with a component 12, especially an information handling system component, that has a front side or panel 14 that has a relatively limited area for displaying various information that may be desired to be displayed to persons operating or maintaining the component. The information system component 12 may generally include a case 16 having a front 18 and a rear, with the front panel 14 being located on the front 18 of the case 16. The case 16 may also include a rear panel on the rear of the case 16. The case 16 may have a top and a bottom, as well as sides that extend rearwardly from the front panel 14. Each of the top, bottom, and sides may include panels. In some implementations, the case 16 may comprise a cabinet that encloses or substantially encloses the elements of the component 12, and in other implementations the case 16 may comprise a tray or cage that provides more limited enclosure for the elements of the component. In most implementations, the case 16 will include the front panel 14.

One highly suitable application of the display system 10 of the disclosure is on a component 12 having a case 16 that is adapted to be mounted on and operate in a rack system 1. The rack system 1 provides a standardized mounting system for the cases of several components in a relatively compact footprint. The rack system 1 often includes a pair of spaced vertical mounting members 2 to which the cases of components are mounted and supported. As previously discussed, the area of the front panel 14 of components designed for mounting on a rack system is greatly limited, and the area that is available is typically highly elongated and of narrow dimension in the vertical direction with respect to the dimension in the horizontal direction. This is especially applicable to components of the 1U size, but also applies to components of the 2U and even 3U sizes. While the system 10 will be described in terms of application on a component 12 configured for mounting on a rack system, it should be recognized that the system is not limited to application with rack systems and is beneficial for use with, for example, any component having a panel with a relatively small area, whether located on the front of the component or on a rear or side of the component. Thus, the case 16 of the component 12 may thus include mounting structure for mounting the housing on a rack support structure of a rack mount system.

The front panel 14 of the case 16 may be substantially vertically oriented when mounted on the rack system 10, and may include user accessible controls as well as various indicators that might typically be located on the component of the type described herein.

The case 16 may include a first connector 22 mounted thereon, and the first connector may be located on the front panel 14. As will become more apparent as this description proceeds, the first connector 22 provides a part of the physical connection of the display system 10 to the case 16 of the component. The first connector 22 may further provide a power connection between the component 12 and the display system 10. The first connector 22 may also provide a data connection between the component, or an element of the component, and the display system 10. The first connector 22 may be structured as a female element, although the invention is not so limited.

In greater detail, the display system 10 may comprise a housing 30. The housing 30 may have a front 32 and a rear 34 located opposite of the front. The housing 30 may have a front face 16 which may have an opening 38 formed therein. The housing 30 has a top 40 and a bottom 42, with a height 44 of the housing being measured between the top 40 and bottom 42.

The display system 10 may further include a screen 46 that is mounted on the housing 30. The screen 46 may be visible on the front 32 of the housing, and be visually perceptible through the opening 38 in the housing 30. The screen 46 may have a height 48 in a direction substantially the same as the housing, such as a vertical direction.

Figure 1:
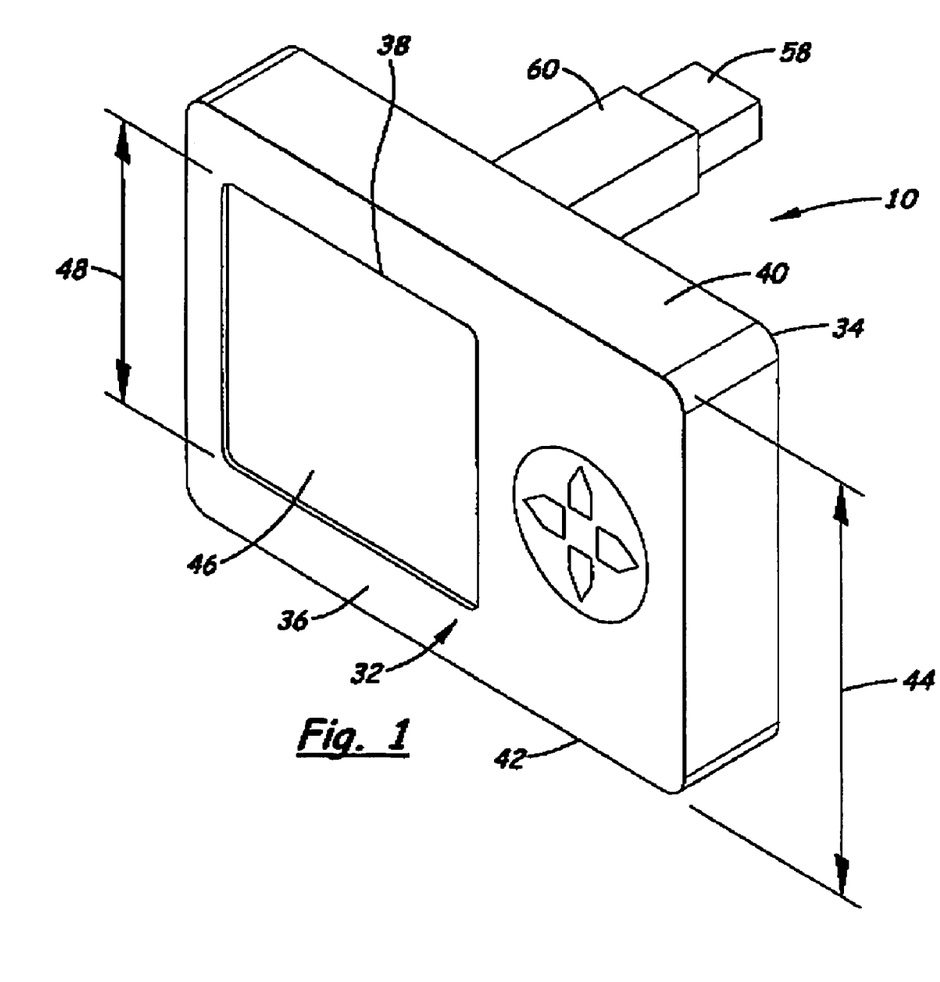
FIG. 1 is a schematic perspective view of a new removable system management information display system according to the present disclosure.
Figure 2:
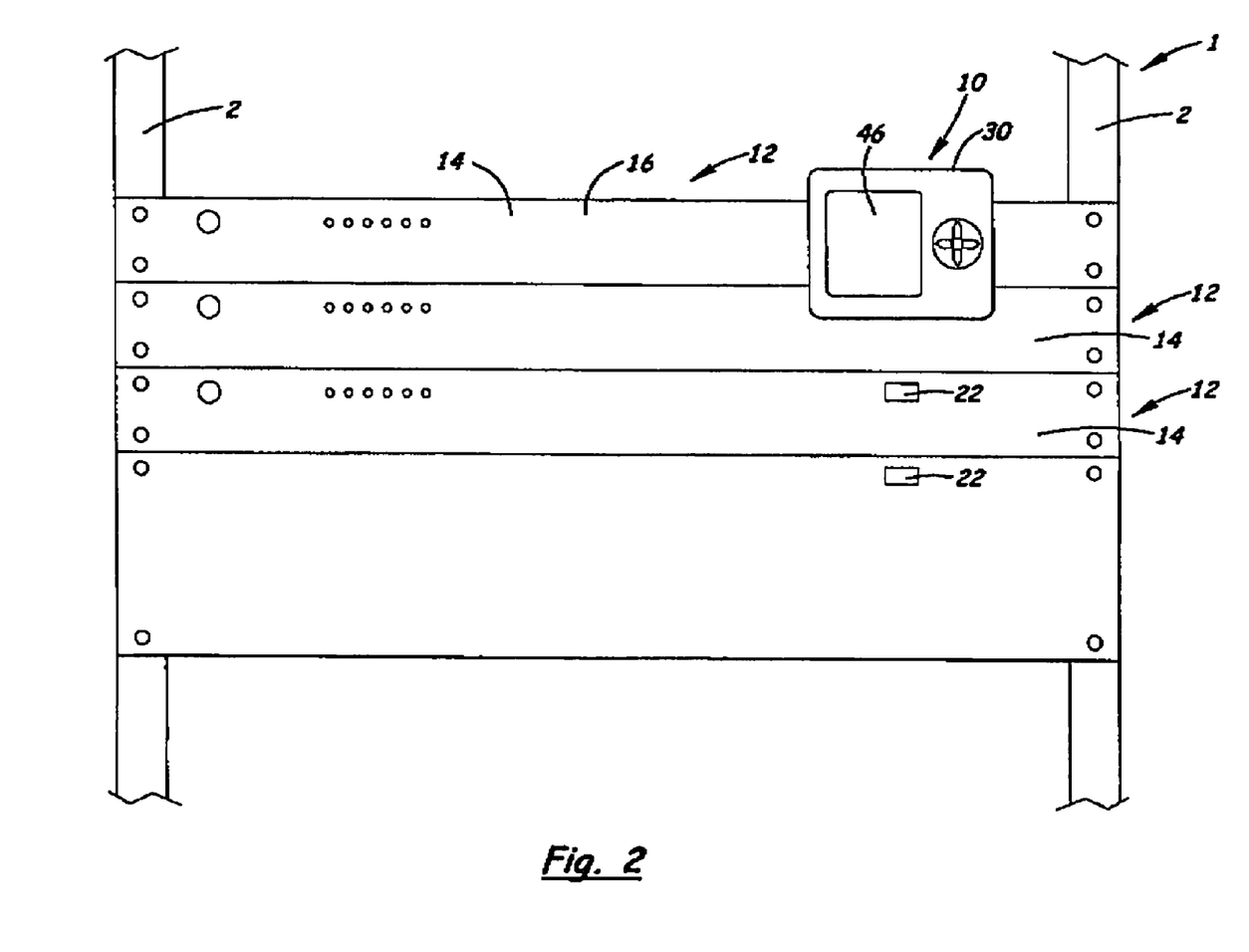
FIG. 2 is a schematic front view of the information display system, according to an illustrative embodiment.
Figure 3:
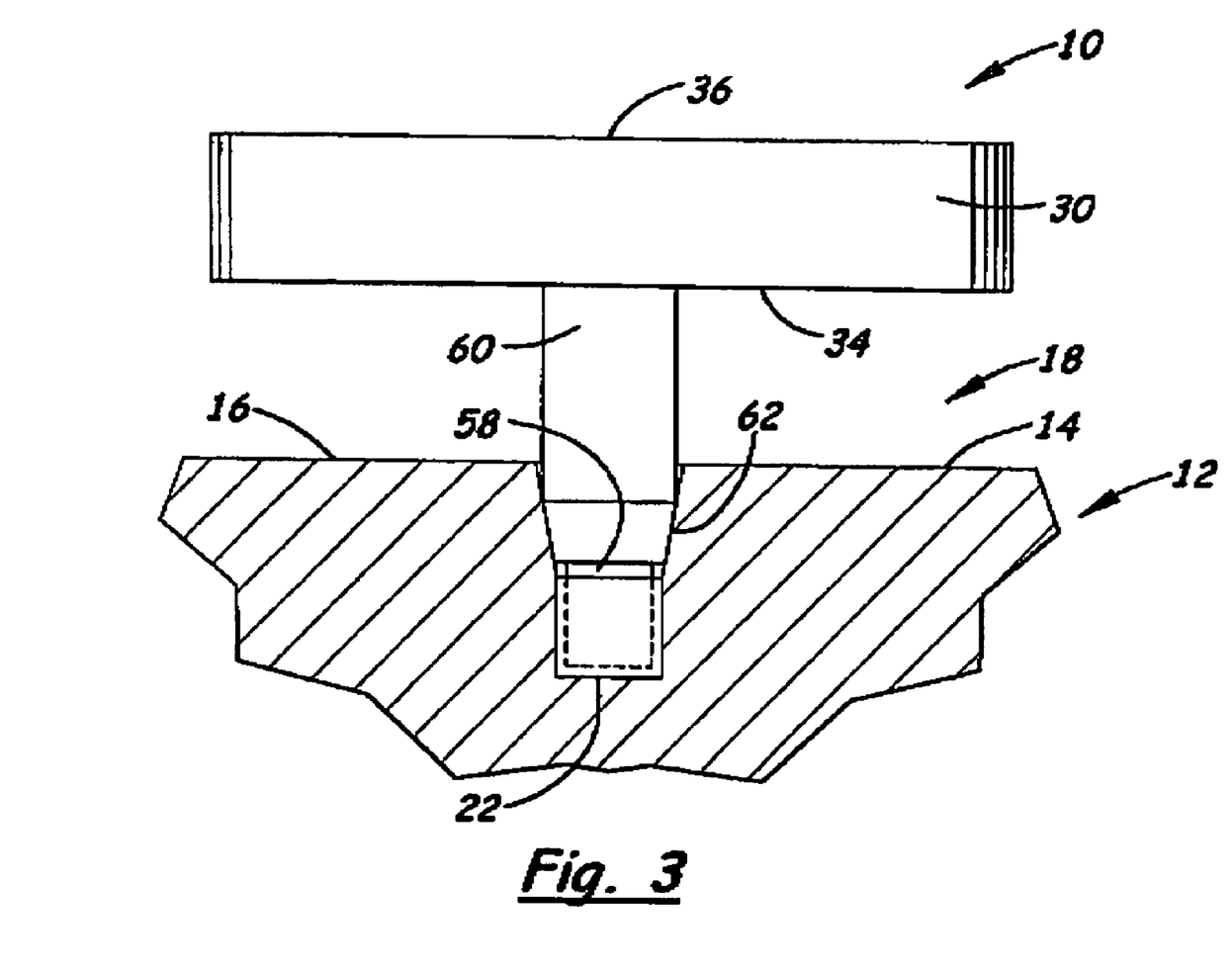
FIG. 3 is a schematic top sectional view of the information display system, according to an illustrative embodiment.
Figure 4:
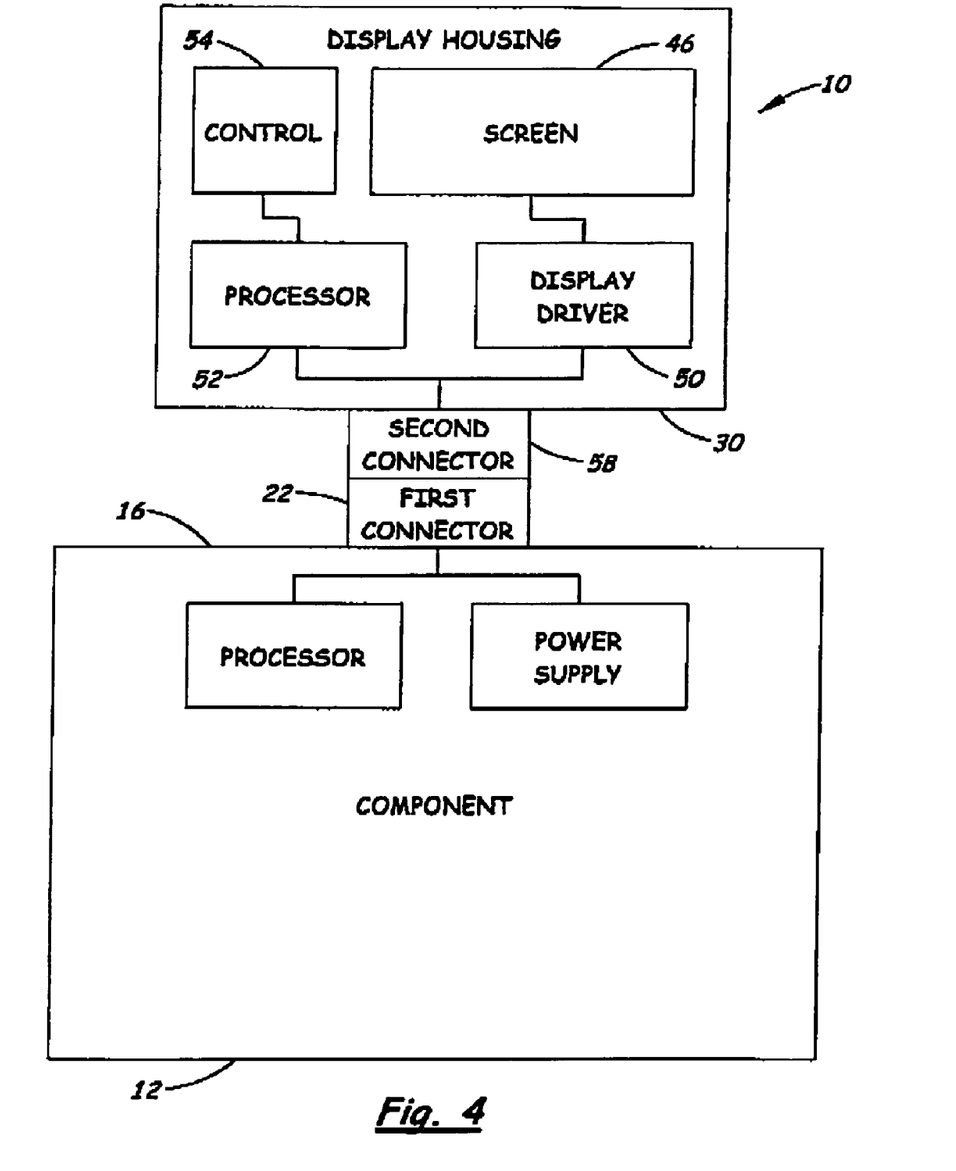
FIG. 4 is a schematic diagrammatic view of one embodiment of the information display system, according to an illustrative embodiment.
Figure 5:
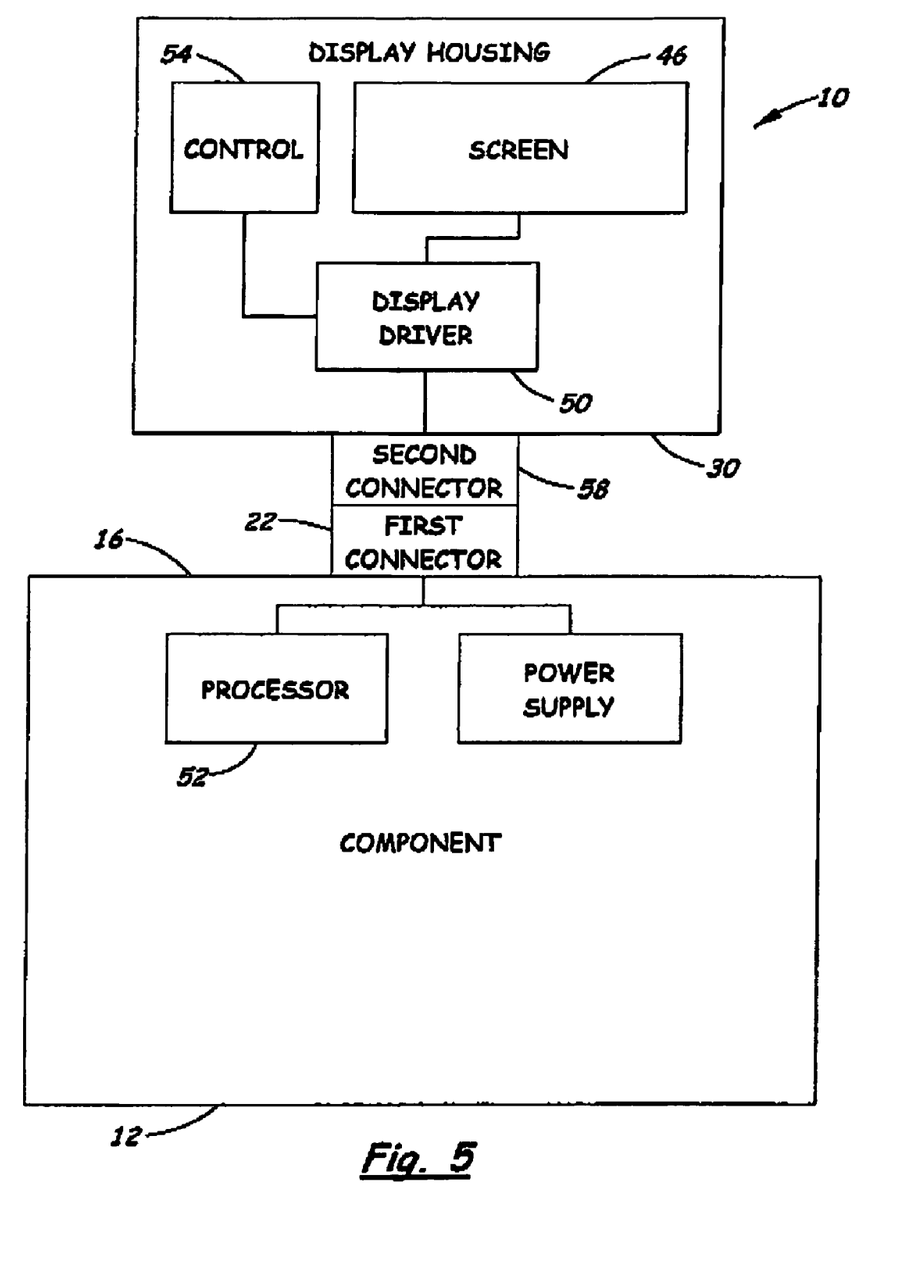
FIG. 5 is a schematic diagrammatic view of another embodiment of the information display system, according to an illustrative embodiment.

Significantly, the height of the housing 30 is not limited to the height of the case 16 of the component 12, and thus the height of the housing 30 may be greater than the height of the front panel 14 of the component 12 (see FIG. 2). Further, the housing 30 may have a height that is greater than 1U, or 1.75 inches, which is the height limitation on a 1U component in a rack system. Perhaps more importantly, the height 48 of the screen 46 on the housing may be greater than the height of the front panel 14 of a 1U component, and does not have to be varied between 1U, 2U, or larger sized components.

The display system 10 may also include a display driver 50 (see FIGS. 4 and 5) that is in communication with the screen 48 and that is configured to cause the display of information on the screen 46. The display driver 50 may be mounted on the housing 30, but may also less preferably be incorporated in the component 12.

The display system 10 may also include a processor 52 that is in communication with the display driver 50 and that is configured to send data to the display driver 50 to cause the display of information on the screen 48. The processor 52 may be configured to monitor processes and operations of the component 12 to derive the desired system management information for the component 12, or may simply receive the diagnostic information from the component. The processor 52 is preferably mounted on the housing 30 (see FIG. 4), but may optionally be incorporated into the component 12 (see FIG. 5).

A control 54 may be included in the display system 10 for controlling an aspect of operation or the display on information on the screen 46. The control 54 may be mounted on the housing on the front face 36, and may be positioned adjacent to the screen 46. The control 54 may be communicatively coupled to the processor 52. In various embodiments, the control 54 may comprise a directional pad for controlling directional movement of a cursor or highlight bar displayed on the screen, and well as permitting the selection of various options or elements displayed on the screen 48.

The display system 10 may include a mount structure 56 that is configured to connect to the information system component 12. The mount structure 56 may removably mount the housing 30 on the case 16 of the component 12. In various embodiments, the mount structure 56 includes a second connector 58 that is configured to removably connect to the first connector 22 on the case 16 of the component 12. The second connector 58 may be located on a stalk 60 or other protrusion from the rear 34 of the housing to provide a degree of spacing between the front panel 14 of the component 12 and the rear 34 of the housing. The second connector 58 may comprise a male element for mating with a female element of the first connector 22 on the case, although the relationship may be reversed without departing from the invention.

In various embodiments, the mount structure 56 may be configured to provide physical support to the housing 30 from the case 16 of the information handling component 12 when the mount structure 56 is connected to the component. Further, the mount structure 56 is configured to provide a data communication connection between the display system 10 and the component 12 when the mount structure 56 is connected to the component 12. The second connector 58 of the mount structure 56 may be in communication with the display driver 50 and/or the processor 52 to provide data from the component 12 that can be displayed on the screen 46. In some embodiments, the mount structure 56 may be configured to provide a power connection between the component 12 and the display system 10 when the mount structure 56 is connected to the component 12. The second connector 58 may thus be in communication with the display driver 50, the processor 52, and the screen 46 to provide power to those elements (as well as any other elements) of the display system 10. Optionally, the display system 10 may include a battery that provides power to the elements of the display system 10, and the battery may be recharged through the connection to the component 12.

In some embodiments, the mount structure 56 may be the sole connection between the display system 10 and the component 12 when the mount structure 58 is connected to the component, although the system 10 is not so limited. The complementary connectors 22, 58 may include any standardized electrical data connector system that is known to one skilled in the art or that may be developed in the future. The electrical data connectors may comprise, for example, a Universal Serial Bus (USB), IEEE 1394 (also known as FIREWIRE), Ethernet, SCSI, and the like. Many standardized data connectors are capable of providing power across the connection, and thus power may be provided to the display system 10 through the connectors 22, 58. Optionally, a power connector may be integrated into the mount that is separate of the data connector. It is preferred that the data connector employed is based upon a "plug and play" protocol or standard that permits connection and disconnection without, for example, powering down the component (or the display system).

Many standardized data connectors are capable of providing a degree of physical support through the connection between the connectors, and the display system 10 may be made of sufficiently lightweight elements that the connection supports the display system on the component. Optionally, a portion of the stalk 60 on which the connector 58 is mounted may insert into a recess 62 in the front panel 14 of the component that provides all or a portion of the physical support for the display system 10 on the component 12 through the bayonet connection (see FIG. 3). The fit between the end of the stalk 60 and the recess 62 may be snug to provide this support, and may optionally include a connection that includes a snap interlock that may be provided by, for example, interlocking ridges that slide over each other to hold the stalk 60 in the recess 62 until a sufficient withdrawing force is applied by the hand of the user to overcome the interlocked ridges.

Where the display system 10 is implemented, two or more components 12 may share the same display system 10 which avoids each component including a dedicated display. Also, the display system 10 may be implemented on components having cases of various sizes, whether 1U, 2U, 3U or virtually another size that is able to accommodate the first connector 22.

It should also be recognized that the use of the display system 10 may find application on other devices in which there is a limited amount of display area on a viewable surface such as a front panel, and there is not a need to be able to continuously view the amount of system information that may be displayed on the display system 10.

In use, a plurality of components 12 mounted on a rack system 1 may be provided with similar first connectors 22 (and optionally a recess or other physical connection structure), and an operator or technician may connect the display system 10 to a first one of the components 12 on the rack system (or other support). Information, such as system management data, may be called up and displayed on the screen 46 using the control 54. Once the information regarding the first component is viewed by the operator, the operator may disconnect the display system 10 from the first component and connect the system 10 to another component for display of system management information from that component. This process may be repeated for any number of components.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

In addition, in the foregoing Detailed Description, it can be seen that various features are described in the context of a single embodiment for the purpose of streamlining the disclosure. The disclosure of a single embodiment is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects. Further, where the term "substantially" is used, it is intended to mean "for the most part" or "being largely but not wholly that which is specified".

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

We claim:

1. A display system for an information system component, the information system component including a case, the case having a first connector, the display system comprising:
   a housing;
   a screen mounted on the housing and configured to display information;
   a control mounted on the housing for controlling an aspect of operation of the screen; and
   a mount structure configured to connect the housing to the information system component, the mount structure removably mounting the housing on the case of the information system component, the mount structure including a second connector configured to removably connect to the first connector on the case of the information system component,
   wherein the mount structure includes a stalk extending from the housing, the stalk having the second connector mounted thereon, and the case of the component includes a recess, the first connector being mounted in the recess; and wherein the stalk is at least partially insertable into the recess of the component.

2. The system of claim 1 wherein the mount structure is configured to provide physical support to the housing from the case of the component when the mount structure is connected to the component.

3. The system of claim 1 wherein the mount structure is configured to provide a data communication connection between the display system and the component when the mount structure is connected to the component.

4. The system of claim 3 wherein the mount structure incorporates a data communication connector such that physically connecting the mount structure to the case of the component provides a connection for data communication between the display system and the component.

5. The system of claim 1 wherein the mount structure is configured to provide a power connection between the component and the display system when the mount structure is connected to the component.

6. The system of claim 1 wherein the mount structure is configured to provide physical support to the housing from the case of the component when the mount structure is connected to the component, wherein the mount structure is configured to provide a data communication connection between the display system and the component when the mount structure is connected to the component, and wherein the mount structure is configured to provide a power connection between the component and the display system when the mount structure is connected to the component.

7. The system of claim 1 wherein the mount structure is the sole connection between the display system and the component when the mount structure is connected to the component.

8. The system of claim 1 wherein the second connector comprises a male element for mating with a female element of the first connector on the case of the component.

9. The system of claim 1 additionally comprising a processor mounted on the housing and in communication with the screen to cause display of data on the screen.

10. A display system, comprising:
    at least two information system components, each of the information system components including a case with a first connector on the case; and
    a display apparatus removably mounted on one of the information system components for displaying information regarding operation of the one information system component, the display apparatus comprising:
      a housing having a front face with an opening therein;
      a screen mounted on the housing and viewable through the opening in the housing; and
      a mount structure configured to connect the housing to the information system component, the mount structure removably mounting the housing on the case of the information system component, the mount structure including a second connector configured to removably connect to the first connector on the case of the information system component,
    wherein the mount structure of the display apparatus includes a stalk extending from the housing, the stalk having the second connector mounted thereon, and the case of the component includes a recess, the first connector being mounted in the recess; and
    wherein the stalk of the display apparatus is at least partially insertable into the recess of the component.

11. The system of claim 10 wherein the display apparatus additionally comprises a control mounted on the housing for controlling an aspect of operation of the screen.

12. The system of claim 10 wherein a front panel on the case of one of the information system components has a height dimension and the screen of the display apparatus has a height dimension; and wherein the height dimension of the screen of the display apparatus is equal to or greater then the height dimension of the front panel of the case.

13. The system of claim 10 wherein the mount structure provides physical support to the housing from the case of the component when the mount structure is connected to the component.

14. The system of claim 10 wherein the mount structure is configured to provide a data communication connection between the display apparatus and the component when the mount structure is connected to the component.

15. The system of claim 14 wherein the mount structure incorporates a data communication connector such that physically connecting the mount structure to the case of the component provides a connection for data communication between the display apparatus and the component.

16. The system of claim 10 wherein the mount structure is configured to provide a power connection between the component and the display apparatus when the mount structure is connected to the component.

17. The system of claim 10 wherein the mount structure is configured to provide physical support to the housing from the case of the component when the mount structure is connected to the component, wherein the mount structure is configured to provide a data communication connection between the display apparatus and the component when the mount structure is connected to the component, and wherein the mount structure is configured to provide a power connection between the component and the display apparatus when the mount structure is connected to the component.

18. The system of claim 10 wherein the case of the component has a height dimension of 1 U, and wherein a height dimension of the housing is greater than 1 U.

* * * * *